United States Patent [19]

Friedman

[11] 4,135,203

[45] Jan. 16, 1979

[54] METHOD AND APPARATUS FOR GENERATING COMPLEX VISUAL PATTERNS

[76] Inventor: Alan M. Friedman, 1306 Abbot Rd., Rockville, Md. 20851

[21] Appl. No.: 498,979

[22] Filed: Aug. 20, 1974

[51] Int. Cl.$^2$ .............. H04N 7/02; H04N 9/62; H04R 5/00; G01R 13/20

[52] U.S. Cl. .................................. 358/93; 358/81; 179/1 G; 179/1 GQ; 324/121 R; 358/139

[58] Field of Search ............... 358/82, 81, 217, 139, 358/10, 93; 178/DIG. 18, 5, 8, DIG. 35; 179/1 SP, 1 GQ, 1 MN, 1 G, 15 BT; 340/324 A, 5 MP, 366 CA, 15.5 DS; 343/5 CD, 17; 315/392, 393, 394, 391, 395; 324/114, 121 R, 76 R, 76 A, 77 R, 77 E, 77 F; 346/108, 109, 110 R, 33 ME; 128/2.1 B

[56] References Cited

U.S. PATENT DOCUMENTS

| | | | |
|---|---|---|---|
| 2,159,790 | 5/1939 | Freistedt et al. | 179/1 SP |
| 2,476,445 | 7/1949 | Lacy | 179/1 |
| 2,492,062 | 12/1949 | Potter | 324/77 E |
| 2,860,627 | 11/1958 | Harden et al. | 346/110 R |
| 2,944,620 | 7/1960 | Van Dijck | 340/15.5 DS |
| 2,998,568 | 8/1961 | Schlessel | 179/1 |
| 3,115,605 | 12/1963 | Coulter | 179/1 |
| 3,195,533 | 7/1965 | Fischer | 128/2.1 B |
| 3,337,684 | 8/1967 | Sadler | 178/DIG. 4 |
| 3,604,852 | 9/1971 | Weintraub | 179/1 SP |
| 3,627,912 | 12/1971 | Hearn | 179/1 |
| 3,629,712 | 12/1971 | Hearn | 358/82 |
| 3,634,759 | 1/1972 | Koshikawa et al. | 179/1 |
| 3,639,691 | 2/1972 | Beninghof | 179/1 |
| 3,639,691 | 2/1972 | Beninghof | 179/1 |
| 3,662,374 | 5/1972 | Harrison et al. | 179/1 |
| 3,699,948 | 10/1972 | Ota et al. | 346/33 ME |
| 3,723,652 | 3/1973 | Alles et al. | 358/82 |
| 3,737,573 | 6/1973 | Kessler | 340/5 |
| 3,860,752 | 1/1975 | Adler et al. | 178/DIG. 18 |

Primary Examiner—John C. Martin
Attorney, Agent, or Firm—Alan M. Friedman

[57] ABSTRACT

A method and apparatus for generating a complex visual pattern in conjunction with a two dimensional display having X and Y deflection means. The method comprises deriving two signals for application to the deflection means, each consisting of a DC component and an AC component. Each of these components contains information which is derived from the combination of one or more audio frequency sources.

Also, a method of encoding $n$ number of audio frequency sources for separate and coherent two dimensional display of each source and of the amplitude, frequency and phase relationships between and among them. The two dimensional display surface is represented as a circular polar coordinate system where each audio source causes displacement of the trace toward a point around the perimeter of the display area. The polar coordinates of each point are trigonometrically translated to cartesian coordinates which determine the amplitudes of the signals to be applied to the X and Y deflection means.

Several forms of two dimensional display for use with the present invention are shown, one involving the instant conversion of a color television to function either in conjunction with the present invention or as a normal receiver, and the other producing a large scale color projection using a tunable dye laser in conjunction with an electro-optical deflection system, and a specially constructed screen.

19 Claims, 7 Drawing Figures

METHOD AND APPARATUS FOR GENERATING COMPLEX VISUAL PATTERNS

BACKGROUND OF THE INVENTION

The present invention relates to visual displays. More particularly it relates to two dimensional displays of multi-channel audio frequency information.

Many methods have been disclosed for presenting a visual display of electrical information. In some cases such displays have been mainly for aesthetic purposes such as, for example, U.S. Pat. No. 3,604,852 and U.S. Pat. No. 3,627,912; while in other cases they have been of educational use such as U.S. Pat. No. 3,335,315, or for use in technical analysis such as the display described in *Journal of the Audio Engineering Society*, Vol. 20, No. 6, pages 483 to 488 entitled "A Quadraphonic Oscilloscope Display Technique," or that disclosed in U.S. Pat. No. 3,806,648. The present invention is useful in all of these areas.

U.S. Pat. No. 3,604,852 discloses a display produced by division of a single audio source into three frequency bands which are detected and applied jointly to both the color grids and the deflection means of a color television. The resulting system is unable to display more than one source of audio information thus being ineffectual for analysis of a multichannel audio system.

U.S. Pat. No. 3,627,912 also uses a color cathode ray tube and applies two channels of audio to the two deflection coils, thus producing a stereo display basically similar to that used for analysis throughout the stereo industry for many years. Also disclosed is a frequency dependent color response which basically divides the audio into three frequency bands which are then detected and applied to the color grids. Since all voltage applied to the deflection coils is AC, the display pattern utilizes only the central portion of the screen where the density of the pattern makes it difficult to observe much of the phase information which could be present between two or more audio sources. This high pattern density also does not allow the full color potential of the display to be visible. Furthermore, the device is only responsive to two channels of audio information.

U.S. Pat. No. 3,335,315 discloses a device for utilization as an educational aid. The device provides a display consisting of animated algebraic, trigonometric or geometric relationships and figures. A function generator is used to sequentially apply specific waveforms to the deflection amplifiers of an ocilliscope in order to produce predetermined singular patterns. This device, however, cannot display randomly occurring multichannel audio information, nor can it be used to analyze the interchannel relationships peculiar to such information.

The article "A Quadraphonic Oscilloscope Display Technique" discusses a method by which four audio sources can be displayed on an oscilloscope cathode ray tube. The sources are each half wave rectified and then translated in a matrix which electrically rotates the display 45°. The matrix outputs are applied to the differential inputs of the vertical and horizontal amplifiers of the oscilloscope. The article mentions that either some phase information or some amplitude information must be lost in the decision of whether to use half or full wave rectification. U.S. Pat. No. 3,806,648 discloses a similar apparatus with several variations.

It is therefore an object of this invention to provide a visual display which can be made to accept any desired number of audio sources, making full use of the amplitude, frequency and phase information of each to produce a complex visual representation of the relationships among those sources.

It is furthermore an object of this invention to provide a visual display over a two dimensional area where the full display area is utilized by movement of the display pattern, which movement is a function of a positioning signal derived from at least one input.

It is another object of this invention to provide a method of encoding a number of audio sources for coherent two dimensional display of the full amplitude, frequency and phase information of each source.

It is a further object to present a novel means of projecting the visual pattern produced by this invention which projection is suitable for viewing by large groups.

It is also an object of the present invention to provide a method of modifying a normal color or black and white television to function either as the two dimensional display means of this invention or for the normal reception of programming.

It is another object to provide a display which can function either as a valuable tool for the audio technician in the analysis of a multichannel audio system, or as a method of providing unique aesthetic visual patterns the position, movement, content and colors of which have direct correspondence to the total information contained in one or more applied audio sources.

SUMMARY OF THE INVENTION

In the present invention it is possible to display total amplitude and phase information, as well as to generate additional information which selectively positions the display pattern within a two dimensional area in direct proportion to the amplitude balance among the multiple audio sources applied.

It has been unexpectedly observed that by the combination of DC information derived from each audio source in the manner of this invention along with AC information also derived from each source, a display could be produced in which the AC component is representative of the amplitude, frequency and phase of each audio source, and where the DC component is derived from positioning information concerning the amplitude and phase relationships among and between all sources.

The two dimensional display area is represented as a plane where any point can be designated by cartesian or polar coordinates. For any specific number of sources n, the display is designed so that each source is assigned a direction from the origin towards an imaginary position somewhere on the perimeter of the two dimensional display area. The angle separating each direction is chosen in the described embodiments as 360/n in order to produce the most evenly distributed pattern. In some cases, one source direction is chosen as lying along the positive X axis with other sources successively distributed counterclockwise. The arrangement of these source directions, however, is optional and can be randomly chosen. I will define at this time, a position vector as the instantaneous position of the center of the display pattern generated by the sound element which is represented by that position vector. An example of a sound element would be a single musical note or chord or single tone burst typically lasting a fraction of a second. If all energy producing a particular position vector is present only at a single audio source, the direction of that position vector would be identical to the corresponding source direction with the amplitude of the sound element determining how far from the origin in that source direction the position vector will lie. If the amplitude of a sound element is equal at two sources, the direction of the position vector produced by that sound element will be along a line bisecting the angle between the source directions of those two sources. The position vector could lie in any direction between the two source directions at any distance from the origin depending upon the amplitude of the sound element at each source. This is a form of vector addition where the amplitude and directions add to produce a new vector in the display plane. If a sound element is present with differing amplitudes at every source, the position vector representing that sound element will be generated by the vector addition of all sources. Any particular position vector designated by direction and amplitude could be represented by a pair of polar coordinates $(r,\theta)$ where $\theta$ is the angle measured from the positive X axis counterclockwise to the line the position vector makes with the origin, and r is the distance of the position vector from the origin.

In a complex multi-source audio system such as that encountered with quadraphonic music, many such sound elements occur almost at once, their position vectors adding to produce the unique display of the instant invention.

In the production of the instantaneous display pattern representing a particular sound element, the DC power derived in the manner of the instant invention is applied either positively or negatively to the X and Y deflection means in such proportions as to produce a deflection to the position vector corresponding to that sound element. Simultaneously, AC power also derived in the invention is applied to X and Y deflection means so as to produce an alternating deflection which is perpendicular to the direction of the DC deflection. It is to be understood that having the AC component 90° from the DC component is an arbitrary choice and any angle desired could be used. Thus each of the instantaneous DC and AC deflections which are derived from single sound elements, combine to form the instantaneous display patterns of the invention. The polarity and proportion of power applied to each of the X and Y deflection means is determined in the present embodiments, by a trigono metric transformation of the polar coordinates of each position vector to cartesian coordinates which designate the proper ratios of power to be applied to each axis. This will be more fully explained below.

Other aims and objects will become clear to those skilled in the art of the present invention from a detailed description of the preferred embodiments thereof, with reference to the attached drawings wherein.

DETAILED DESCRIPTION OF THE PREFERRED EMBODIMENTS

Figure 1:
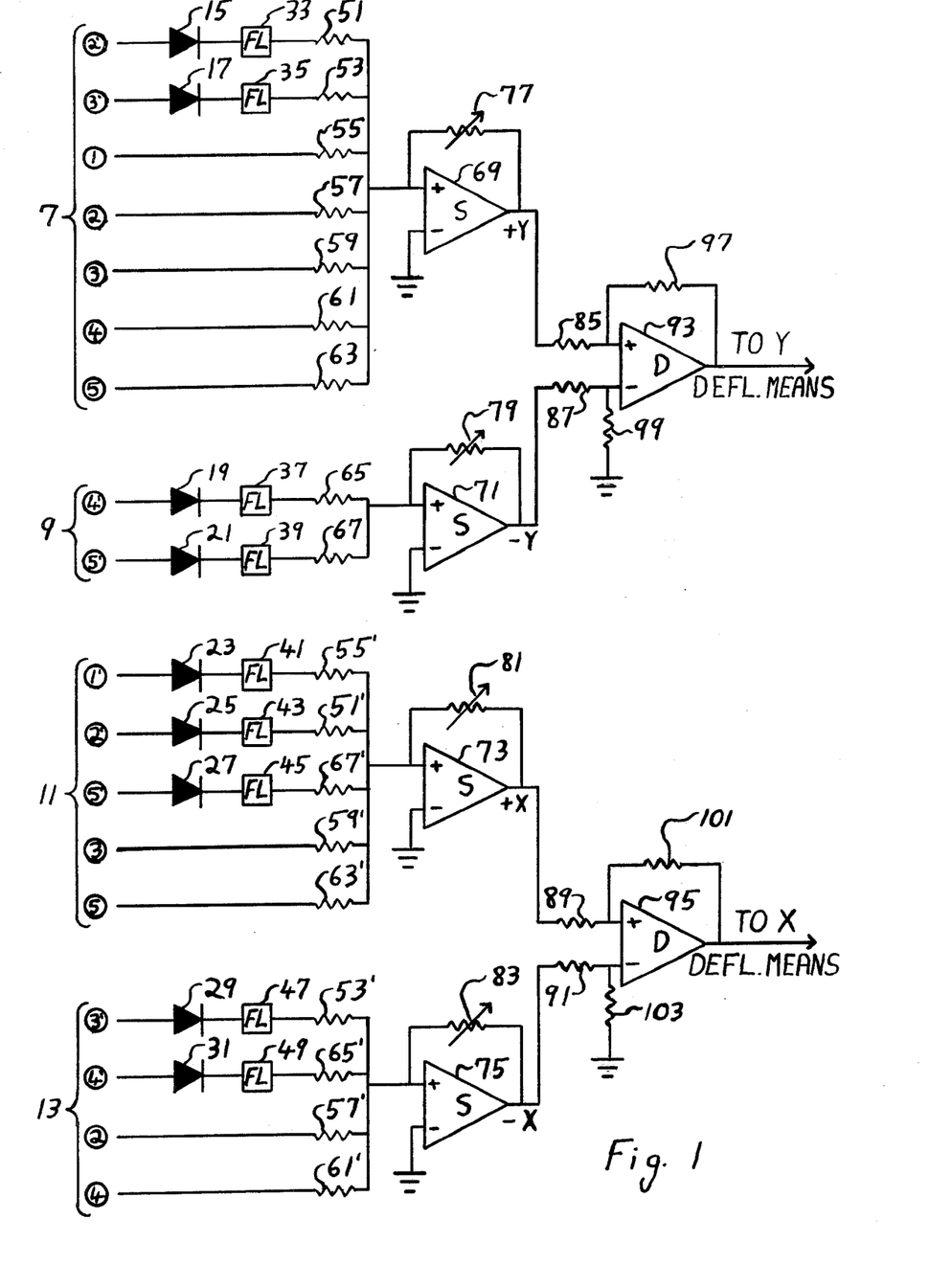
FIG. 1 is a schematic diagram of an embodiment of the present invention designed for five inputs.

Reference is made to FIG. 1 wherein there is shown a schematic diagram of an embodiment of the invention as designed for five audio sources. It can be seen that audio input sources 1, 2, 3, 4 and 5 some of which are applied at more than one point, are separated into a plurality of groups 7, 9, 11 and 13. Certain of these audio input sources are applied to a plurality of diodes 15, 17, 19, 21, 23, 25, 27, 29 and 31 which are in turn connected to a plurality of filters 33, 35, 37, 39, 41, 43, 45, 47 and 49. These can be RC filters or any other type known in the art which can remove high frequency components and allow DC to pass. The upper frequency limit of these filters is arbitrary. Where the audio sources are applied to those diodes and filters they are designated 1', 2', 3' and 4' for clarity although in this embodiment they are identical to 1, 2, 3 and 4. All audio input sources are connected either through the filters or directly to a plurality of summing resistors 51, 53, 55, 57, 59, 61, 63, 65, 67, 51', 53', 55', 57', 59', 61', 63', 65' and 67'. Where the audio sources are applied directly to the summing resistors, the AC components of the display patterns of the instant invention are produced. Where the sources are connected through diodes and filters, the DC positioning components are produced. The ratio of these summing resistors, i.e., 51/51', 53/53', etc., determine the DC positioning deflection caused by each source as well as the direction of its corresponding AC deflection. This will be explained further below.

The output from summing resistors in each of groups 7, 9, 11 and 13 are connected to summing amplifiers 69, 71, 73 and 75 respectively. These summing amplifiers have respective adjustable gain resistors 77, 79, 81 and 83. The output of each of the summing amplifiers is applied to resistors 85, 87, 89 and 91 which control the gain of differential amplifiers 93 and 95 in combination with resistors 97, 99, 101 and 103.

The combination of rectified and unrectified inputs indicated at 7 and summed in summing amplifier 69 constitutes the information producing deflection along the positive Y axis. Similarly, input groups 9, 11 and 13 applied through summing amplifiers 71, 73 and 75 comprise the information producing −Y, +X and −X deflections respectively. The gain resistors 77, 79, 81 and 83 control the amplitude of deflection in each of the four mutually perpendicular directions. Differential amplifiers 93 and 95 are connected to the X and Y deflection means of whatever two dimensional display device is utilized. Alternatively, the signals from amplifiers 93 and 95 can be recorded and applied at a later time to the display device. Note that differential amplifier 93 produces a positive Y deflection for input group 7 and a negative Y deflection for input group 9. Similarly, differential amplifier 95 produces a positive X deflection for group 11 and a negative X deflection for group 13. The process by which the composition of audio source input groups 7–13 is determined will now be explained with reference to both FIG. 1 and FIG. 3.

Figure 3:
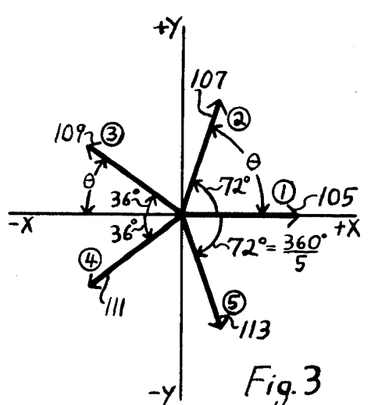
FIG. 3 is a cartesian representation showing the two dimensional display plane of an embodiment of the present invention utilizing five audio sources.

FIG. 3, which is a graphical representation of a two dimensional display surface, illustrates a plurality of source directions 105, 107, 109, 111 and 113. These source directions indicate the DC positioning deflections contributed by audio sources 1-5 respectively. These directions are completely arbitrary, and for ease of explanation are chosen to be symetrically distributed with a separtion in degrees of 360°/5 or 72°. Source direction 105 which corresponds to audio source 1, is chosen to lie along the positive X axis in this case. As discussed previously, it is intended that the DC and AC components of each audio source as generated by the described embodiments of the present invention be applied to the deflection means so as to appear perpendicular to each other in the display plane. Thus, for example, the DC positioning component generated from audio source 1 by diode 23 and filter 41 is a member solely of input group 11 which causes a positive deflection along the X axis, and AC information from audio source 1 is a member solely of input 7 so as to cause deflection only on the Y axis. It can be seen that whether the AC component of any audio source is applied to a positive or negative deflection input affects its phase in relation to the corresponding DC component as well as to other source components. In these embodiments, the phase of all AC components in chosen to be positive with respect to the Y axis and either positive or negative with respect to the X axis in order to maintain their perpendicularity to their respective DC components. Thus, to reiterate, audio source 1 creates a DC positioning component along the positive X axis, and an AC component along the Y axis. Since the AC components of audio source 1 and the DC components derived therefrom are each applied at one point only, summing resistors 55 and 55' do not function in the same manner as other resistor pairs. The ratio of the values of resistors 55 and 55' has no effect on the direction of DC and AC deflections.

Audio source 2 has source direction 107 which lies in the +X+Y quadrant of the display, so that the DC positioning component of source 2 must be present on both the +Y axis and the +X axis. Thus audio source 2 is present both in input group 7 where it is applied through diode 15, filter 33 and summing resistor 51, and in input group 11 where it is applied through diode 25, filter 43 and summing resistor 51'. It should be noted at this point that diodes 15 and 25 and filters 33 and 43 perform identical functions on the same information and so may be combined into one diode and one filter which would then be connected to both resistors 51 and 51'. These components are shown as they are mainly for diagrammatic simplicity. It should also be noted that by selection of the proper pair of input groups from 7, 9, 11 and 13, it is possible to create a deflection in any quadrant of the cartesian coordinate surface. It remains to create a particular angle of deflection within the 90° of any particular quadrant, which is the function of the resistors pairs. The ratio of the value of +Y axis summing resistor 51 to +X axis summing resistor 51' determines the direction of deflection within the +X+Y quadrant caused by the DC positioning component of audio source 2. From the laws of trigonometry it is known that the cartesian coordinate ratios X/Y and Y/X are constant for any point along a line forming an angle $\theta$ with the X axis as long as $\theta$ is 90° or less. This is true for either the positive or the negative X axis. We are not concerned with the polarity of these ratios since we determined that by selection of input groups. The ratios X/Y and Y/X are known as the cotangent and tangent respectively of the angle $\theta$. I have found that if the ratio of summing resistor 51 to summing resistor 51' corresponds to the cotangent of the angle $\theta$ made by source direction 107 with the X axis, the proper ratio of power will be applied to each axis to create deflection in the desired source direction 107. As long as the angle $\theta$ is measured from the positive or negative X axis toward either the positive or negative Y axis, the tangent or cotangent of $\theta$ will give the ratio of power Y/X or X/Y respectively to be applied to the two deflection means. Since the angle between the X axis and source direction 107 is 72° and the tangent of this angle is 3.0777, the Y axis should receive approximately 3 times the power received by the X axis. To produce this ratio, resistor 51 is made ⅓ the value of resistor 51'. Note that the tangent of $\theta$ is the proper ratio of power to the deflection means while the cotangent of $\theta$ is the proper ratio of resistor values. To produce an AC deflection from audio source 2 which is perpendicular to its above described DC deflection, it is necessary only to apply audio source 2 to input groups 7 and 13 and through resistors 57 and 57' without detection or filtering. To apply the proper ratio of power to each axis requires only the reversal of the proportions of DC component applied. The X axis then should receive 3 times the power received by the Y axis, and so resistor 57' should be ⅓ the value of resistor 57.

Audio source 3 has source direction 109 which lies in the quadrant produced by the positive Y and negative X axes and so is applied to both input group 7 through diode 17, filter 35 and resistor 53 and to input group 13 through diode 29, filter 47 and resistor 53'. The ratio of resistor 53 to resistor 53' is the cotangent of the angle measured from the negative X axis to source direction 109. Since this angle is 36°, resistor 53 which controls positive Y axis power should have a value 1.3764 times the value of resistor 53' which controls negative X axis power. It is interesting to note once again that while the ratio of the Y axis resistor to the X axis resistor should be equal to the cotangent of 36° or 1.3764, the ratio of Y axis power to X axis power should be the inverse of this number, or 0.7265 which is the tangent of 36°. In order to produce an AC deflection perpendicular to the DC deflection, audio source 3 is also applied directly to resistors 59 and 59' in input groups 7 and 11 respectively. In this case, however, the situation described above is exactly reversed. To produce a deflection 90° away involves the complement of 36°, so that the ratio of the Y axis resistor to the X axis resistor is 0.7265, the tangent of 36° and the cotangent of 54°, and the ratio of Y axis power to X axis power is 1.3764 which is the cotangent of 36° or the tangent of 54°.

The case of audio source 4 is similar to that just described since the deflection angles of both its DC positioning component, source direction 111 and its AC component are similar to those of audio source 3 and are simply on the opposite side of the X axis. This creates a situation where different input groups, but the same resistor ratios are utilized. Thus, the DC positioning component for audio source 4 is generated by applying the source to group 9 through diode 19, filter 37 and resistor 65 and to group 13 through diode 31, filter 49 and resistor 65', while the ratio of the values of resistor 65 to resistor 65' is identical to the ratio of resistor 53 to resistor 53'. Similarly, the AC component of audio source 4 is generated by application to input group 7 through resistor 61 and to input group 13 through resistor 61'. Again, the ratio of resistor 61 to resistor 61' is the same as the ratio of resistor 59 to resistor 59', this latter pair determining the ratio of AC power from audio source 3.

Audio source 5 has source direction 113 which is 72° from the X axis as was source direction 107. Audio source 5 is applied both to input group 9 through diode 21, filter 39 and resistor 67 and to input group 11 through diode 27, filter 45 and resistor 67'. AC power from audio source 5 is applied to input group 7 through resistor 63 and to input group 11 through resistor 63'. Since $\theta$ in this case is the same as for audio source 2, the DC and AC resistor ratios 67/67' and 63/63' respectively will be identical to the ratios used for audio source 2.

Figure 2:
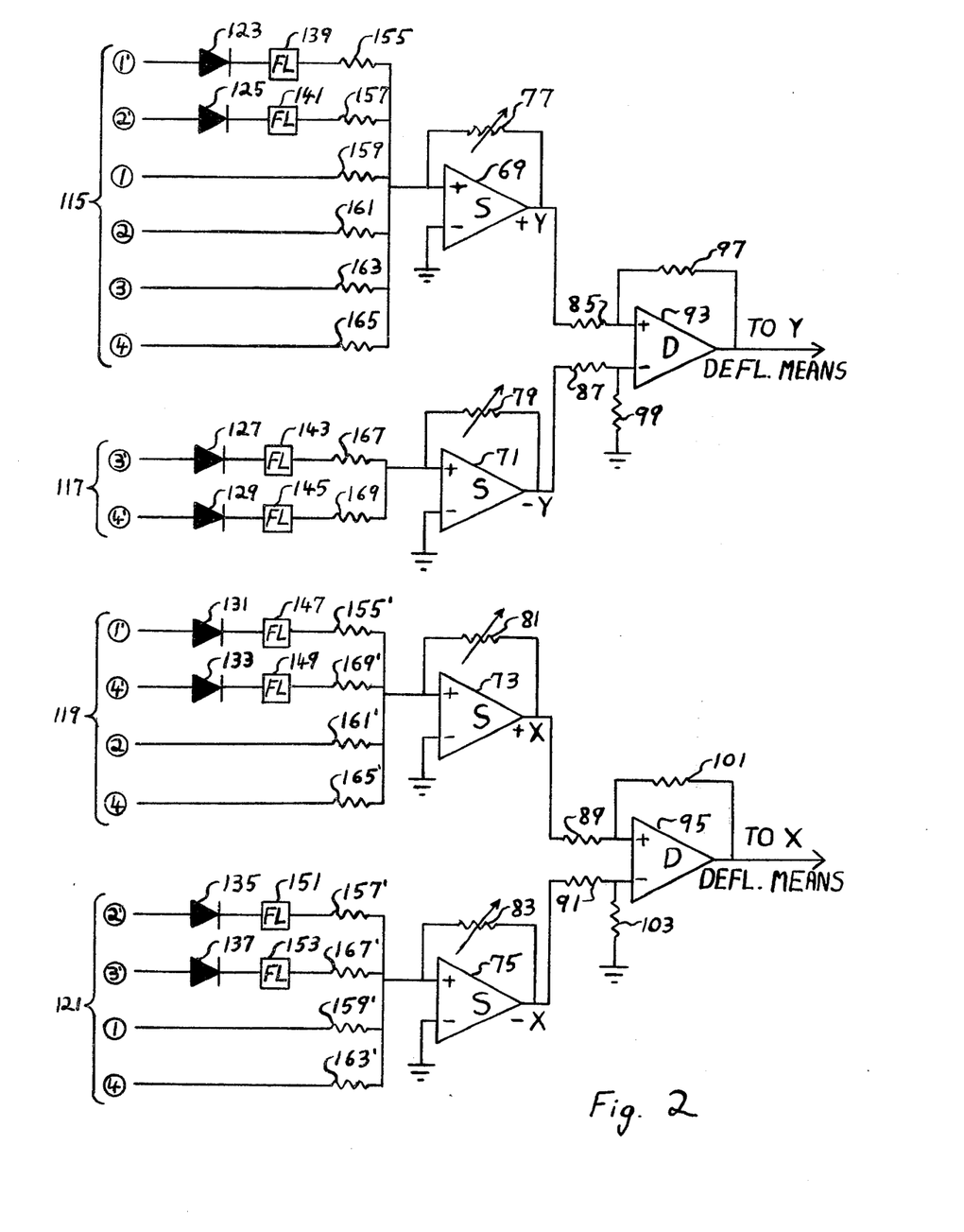
FIG. 2 is a schematic diagram of an embodiment of the present invention designed for four inputs.
Figure 5:
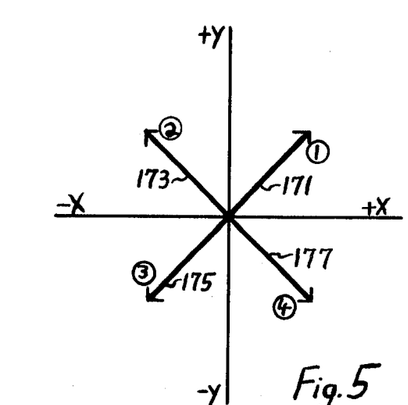
FIG. 5 is a cartesian representation showing the display plane of an embodiment of the present invention utilizing four audio sources.

FIG. 2 and FIG. 5 show another embodiment of the present invention which is designed for four audio input sources. The schematic of this embodiment shown in FIG. 2 is similar to that of the five source embodiment described above. It can be seen that summing amplifiers 69, 71, 73 and 75 and differential amplifiers 93 and 95 remain the same and perform the same functions as do their associated gain resistors 77, 79, 81, 83, 85, 87, 89, 91, 97, 99, 101 and 103. Audio sources 1, 2, 3 and 4 are applied in some cases to diodes 123, 125, 127, 129, 131, 133, 135 and 137 which are in turn connected to filters 139, 141, 143, 145, 147, 149, 151 and 153. As in the previous embodiment, the audio sources are connected either through the filters or directly to summing resistors 155, 157, 159, 161, 163, 165, 167, 169, 155', 157', 159', 161', 163', 165', 167' and 169'. Input groups 115, 117, 119 and 121 contain both AC and DC information which will cause +Y, −Y, +X and −X deflections respectively. FIG. 5 shows source directions 171, 173, 175 and 177 which respectively correspond to the four audio sources of this embodiment. Source direction 171 is the direction of deflection produced by the DC positioning component of audio source 1. This DC deflection is generated by applying audio source 1 to input group 115 through diode 123, filter 139, and summing resistor 155 which causes a positive Y axis deflection, and to input group 119 through diode 131, filter 147 and resistor 155' which causes a positive X axis deflection. It can be seen from FIG. 5 that in this embodiment, all source directions are 45° from the nearest axis. This simplifies the values of all summing resistors since each pair will be equal in value due to the fact that the tangent or cotangent of 45° is 1 which also becomes the resistor and power ratios. Thus resistors 155 and 155' are the same value. The AC component of audio source 1 is produced by input to groups 115 and 121 through resistors 159 and 159' which are also of equal value.

Audio source 2 is applied to input group 115 through diode 125, filter 141 and resistor 157, and to input group 121 through diode 135, filter 151 and resistor 157' thus producing a DC deflection in source direction 173. Resistors 157 and 157' are equal in value. The AC component is produced by applying audio source 2 to input groups 115 and 119 through resistors 161 and 161' which also have the same value.

To produce DC deflection in source direction 175, audio source 3 is applied to input group 117 through diode 127, filter 143 and resistor 167 and to input group 121 through diode 137, filter 153 and resistor 167'. The AC component is produced by applying audio source 3 to input groups 115 and 121 through resistors 163 and 163'. As before, both resistor pairs are equal in value.

The DC positioning component of audio source 4 is produced by applying the source to input group 117 through diode 129, filter 145 and resistor 169 and to input group 119 through diode 133, filter 149 and resistor 169'. Both resistors are the same value as are resistors 165 and 165' in input groups 115 and 119 to which is applied audio source 4 for generation of its AC component.

Figure 4:
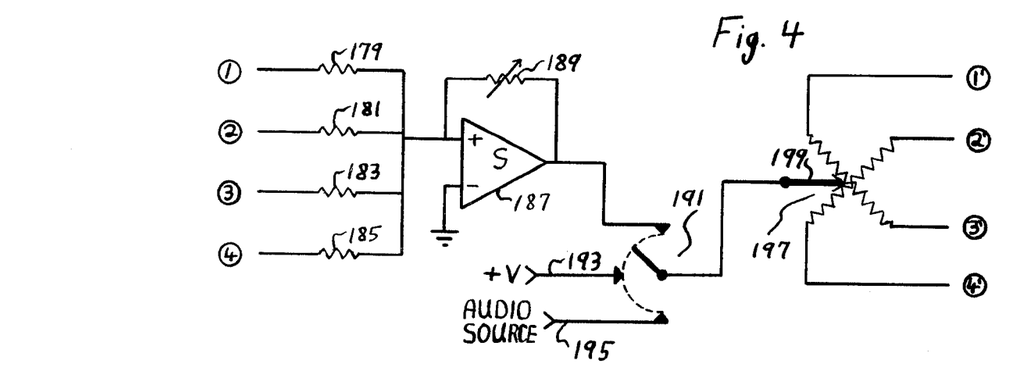
FIG. 4 is a schematic diagram illustrating several other methods of deriving the DC positioning component of the present invention.

In the embodiments described above, the DC positioning components are derived individually from audio sources and then summed in specific combinations for application to the deflection means. FIG. 4 is a schematic diagram showing several different manners of deriving the DC positioning components. Audio sources 1, 2, 3 and 4 are applied to summing resistors 179, 181, 183, 185 and summed in summing amplifier 187. Variable resistor 189 controls its gain. A multiple contact switch 191 can connect either the output of summing amplifier 187, DC voltage source 193, or any single audio source 195, to variable resistor 197. This is a variable resistor constructed so that a signal applied to contact 199 can be proportionally distributed among the remaining four contacts of the resistor as desired. One type of variable resistor which would be desirable in this application would be the "Joystick" type used in many quadraphonic devices. The four outputs from this "Joystick" resistor are applied to points 1', 2', 3' and 4' in FIG. 2, thus replacing audio sources 1, 2, 3 and 4 in this embodiment. In the event DC voltage source 193 is used alone, diodes 123 through 137 and filters 139 through 153 may not be necessary. However, this DC voltage source would in all likelihood be used simply to add to the DC positioning components being generated as previously described in order to supplement the balance of the display pattern.

By utilizing the components in FIG. 4, especially the "Joystick" control, the position of the display pattern on the two-dimensional display surface could be adjusted in the case of deficient balance among the four audio sources applied. Similar results could be obtained by incorporating a "Joystick" control into gain resistors 77, 79, 81 and 83 of FIG. 2. This could be especially valuable where the sources applied to the present invention are original audio frequency signals, and the resulting display pattern is being originally synthesized. This visual pattern synthesis which is one very valuable application of the present invention, is well known in the art as illustrated by U.S. Pat. No. 3,742,125.

Figure 6:
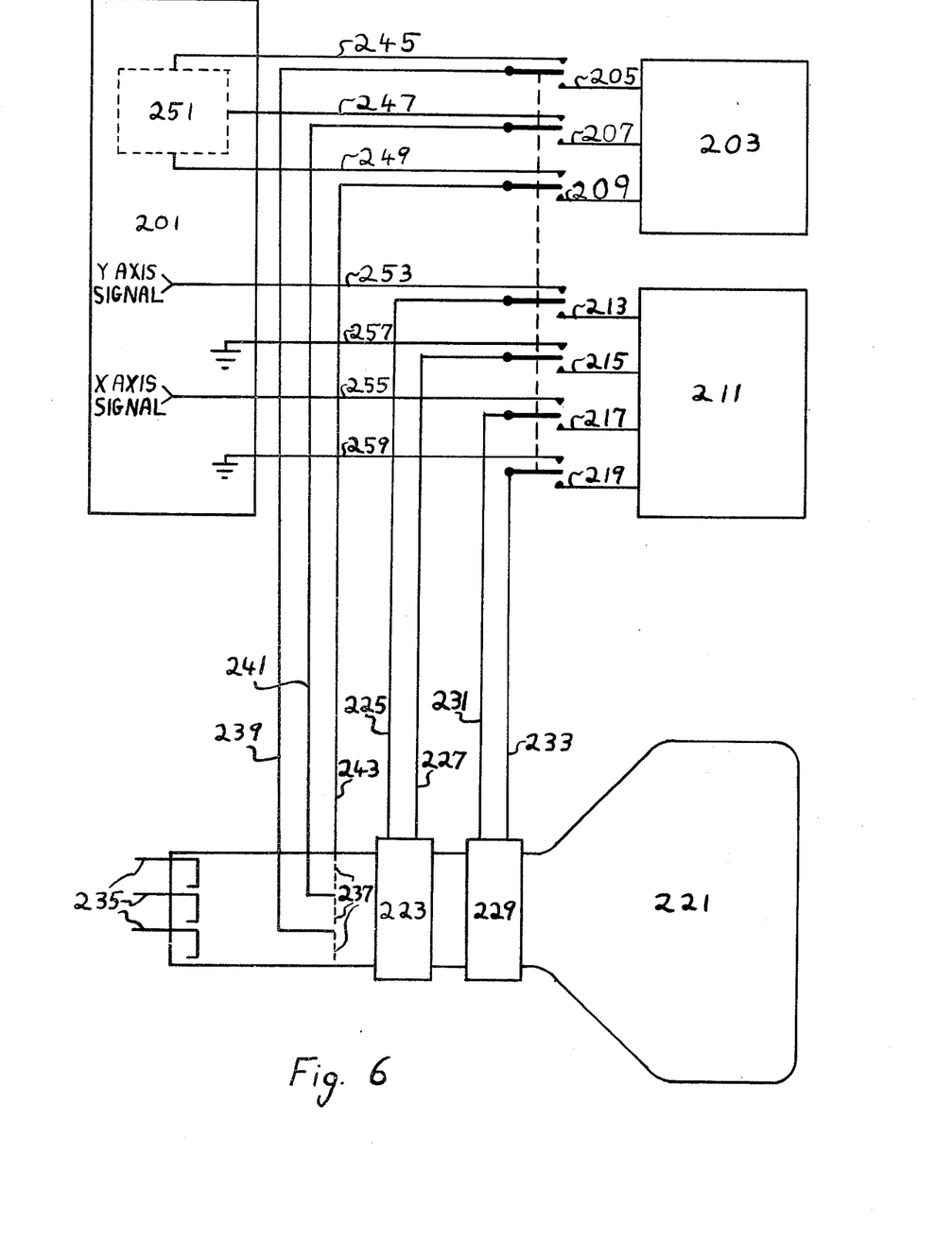
FIG. 6 is a diagram of the present invention connected to a conventional color television.

Attention is now called to FIG. 6 which illustrates the utilization of an ordinary color television receiver as the two dimensional display device to be used in conjunction with the present invention. Shown in FIG. 6 are only those parts of the color television receiver which it is necessary to connect to the present invention, shown at 201. The television color circuits are shown at 203 and have red, green, and blue control grid outputs shown at 205, 207 and 209. The television deflection circuits shown at 211 have vertical deflection outputs 213 and 215 and horizontal deflection outputs 217 and 219. The color cathode ray tube 221 has vertical deflection means 223 with inputs 225 and 227 and horizontal deflection means 229 with inputs 231 and 233, as well as three color cathodes 235. Red, green and blue control grids are shown at 237 with inputs 239, 241 and 243. Signals present on 245, 247 and 249 are applied to grids 239, 241 and 243 and are generated in 251 which is a color modulator. This can be comprised of three audio band-pass filters one of which drives each color grid or can be any method of color modulation desired. A particularly effective type of color modulation which has been found to complement the display of the invention very well is to utilize amplified phase relationships present between various points in the circuits described previously to provide modulating voltages for the color grids. The X axis and Y axis signals generated as previously described by the invention 201, are present on outputs 253 and 255. These display signals are applied to deflection coils 223 and 229 through connections 225 and 231 while the other connections on each coil, 227 and 233, are grounded through connections 257 and 259.

Each of the connections 225, 227, 231, 233, 239, 241 and 243 which accept signals required by the CRT 221 can be switched between either connections 205, 207, 209, 213, 215, 217 and 219 respectively, which supply normal television operation signals or connections 245, 247, 249, 253, 255, 257 and 259 which supply voltages producing the display of the present invention. All seven switches are ganged together and can be a multi-contact relay or ordinary single-pole double-throw switches.

Figure 7:
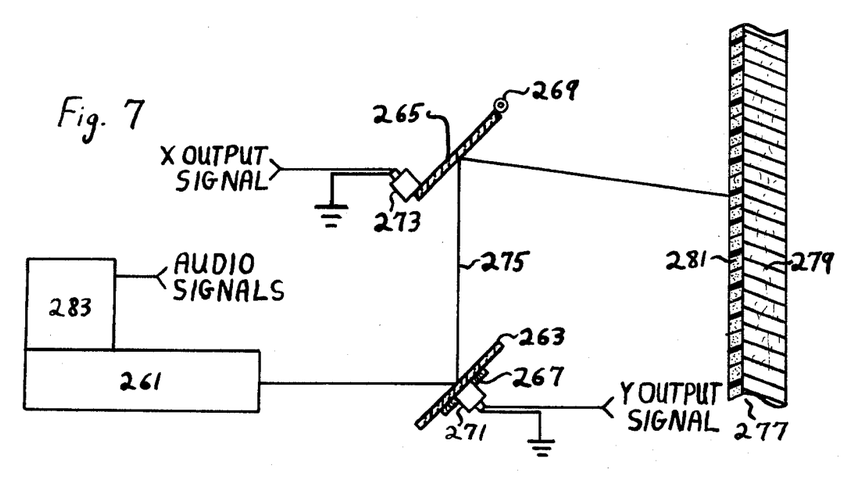
FIG. 7 is a diagram of a laser projection system for use with the present invention.

Shown in FIG. 7 is another two dimensional display system for use with the present invention. In this embodiment, a laser 261 is reflected by two extremely light weight mirrors 263 and 265 each of which are electro-mechanically responsive to the X and Y deflection signals described previously. Both mirrors have hinges 267 and 269 and electromagnetic coils 271 and 273 which change the angle of reflection in response to electrical signals. These coils and hinges are placed so as to move the mirrors in planes which are perpendicular to one another in order to create the X and Y axis deflection required. The laser beam, 275, is reflected to a screen 277 which can be comprised of a substrate 279 coated with a phosphorescent material 281 which is excited by the laser to a condition of secondary emmission. This material functions essentially similar to the phosphors of a cathode ray tube. A full color display can be provided by several means. The phosphor may consist of three materials, each emitting one of the primary colors, and each being excited by a separate wavelength of light. Alternatively, the phosphor can be replaced with a highly reflective white coating which reflects whatever color it receives. In either of these cases a tunable laser such as a liquid dye laser is utilized which can be selectively tuned by appropriate tuning means 283, well known in the art, to any wavelength desired, in direct response to the amplitude, frequency or phase of one or more audio frequency signals.

Having thus described certain specific embodiments, it should be understood that many modifications and changes thereof are possible without departing from the spirit and scope of the invention as defined in the appended claims.

I claim:

1. A method of producing a visual pattern from input audio frequency signals on a display means having at least first and second deflection means comprising the steps of:

deriving at least one a.c. signal which is a function of said input audio frequency signals, said a.c. signal within the audio frequency range, directly applying said a.c. signal to said first deflection means to produce a corresponding image of said a.c. signal, and providing at least one d.c. signal to said second deflection means which varies in accordance with positioning information related to said a.c. signal and which positions the image of said a.c. signal on said display means.

2. A method as recited in claim 1 further including the steps of:

deriving said A.C. signals from at least two audio sources, providing a first D.C. signal which is a function of one of said audio sources, providing a second D.C. signal which is a function of a second one of said audio sources, applying said first D.C. signal to said display means for producing a first positioning component of said visual pattern along a first direction, and applying said second D.C. signal to said display means for producing a second positioning component of said visual pattern along a second direction.

3. A method as recited in claim 2 further including the step of varying said first and second D.C. signals in response to the magnitude of said first and second audio sources.

4. A method as recited in claim 2 further including the steps of:

applying A.C. signals from said one audio source to said display means for producing an A.C. component of said visual pattern along a direction substantially perpendicular to said first positioning component, and applying A.C. signals from said second audio source to said display means for producing an A.C. component of said visual pattern along a direction substantially perpendicular to said second positioning component.

5. A method as recited in claim 1 further including the steps of:

originating said audio frequency signals, and originating said positioning information.

6. A method as recited in claim 1 further including the step of manually varying said D.C. signals.

7. A system for generation of a visual pattern on a display means having at least first and second deflection means from audio frequency signals comprising:

input means for connection to audio frequency signals, means connected between said input means and said first deflection means for deriving at least one a.c. signal which is within the audio frequency range and which is a function of said audio frequency signals, and means connected between said input means and said second deflection means for providing at least one d.c. signal which varies in accordance with positioning information related to said a.c. signal and which positions an image of said a.c. signal on said display means, whereby said a.c. signal and said d.c. signal are coupled to said display means for producing a visual pattern.

8. A system as recited in claim 7 further comprising:

means for deriving said A.C. signals from at least two audio sources, means for providing a first D.C. signal which is a function of one of said audio sources, and means for providing a second D.C. signal which is a function of a second one of said audio sources.

9. A system as recited in claim 8 further comprising means for varying said first and second D.C. signals in response to the magnitude of said first and second audio sources.

10. A system as recited in claim 7 further comprising:

means for originating said audio frequency signals, and means for originating said positioning information.

11. A system as recited in claim 7 further comprising means for manually varying said D.C. signals.

12. A system as recited in claim 7 wherein said display means comprises a T.V. receiver.

13. A system as recited in claim 7 wherein said display means comprises:

a tunable laser, and said system further comprises means to change the output wavelength of said tunable laser in response to audio frequency signals.

14. A system as recited in claim 7 further comprising means for recording said output signals.

15. A system for separately and coherently representing at least first and second AC signals in the display plane of a two dimensional display means comprising:

input means for connection to said first and second AC signals, output means for connection to first and second deflection means of said two dimensional display means, means for deriving first DC signals responsive to a relationship between said first and second AC signals, means for applying at least a portion of said first DC signals to said first deflection means of said two dimensional display means; and means for applying at least a portion of said first and second AC signals to said second deflection means of said two dimensional display means.

16. A system as recited in claim 15 wherein at least four AC signals are displayed and further comprising:

means for deriving second DC signals responsive to a relationship between third and fourth AC signals, means for combining at least a portion of said third and fourth AC signals with at least a portion of said first DC signals in order to form an output signal for application to said first deflection means of said two dimensional display means, and means for combining at least a portion of said second DC signals with at least a portion of said first and second AC signals in order to form an output signal for application to said second deflection means of said two dimensional display means.

17. A method of representing at least four AC signals separately and coherently in the display plane of a two dimensional display means comprising the steps of:

deriving first group of DC signals responsive to a relationship between first and second AC signals, deriving second DC signals responsive to a relationship between third and fourth AC signals, combining at least a portion of said first and second AC signals with at least a portion of said second DC signals in order to form an output signal and applying same to a first deflection means of a two dimensional display means, and combining at least a portion of said first DC signals with at least a portion of said third and fourth AC signals in order to form an output signal and applying same to a second deflection means of said two dimensional display means.

18. A system as recited in claim 15 further comprising:

means for originating D.C. signals, and means for applying at least one of said originated D.C. signals to said means for deriving D.C. signals.

19. A system as recited in claim 18 wherein said means for originating DC signals comprises a variable resistor the resistance of which is adjustable between at least one input and at least four outputs.

* * * * *